(12) United States Patent
Goat et al.

(10) Patent No.: US 7,745,974 B2
(45) Date of Patent: Jun. 29, 2010

(54) REDUCING STRESS GRADIENTS WITHIN PIEZOELECTRIC ACTUATORS

(75) Inventors: Christopher A. Goat, Offham (GB); Michael Peter Cooke, Gillingham (GB)

(73) Assignee: Delphi Technologies Holding S.a.r.l., Troy, MI (US)

( * ) Notice: Subject to any disclaimer, the term of this patent is extended or adjusted under 35 U.S.C. 154(b) by 277 days.

(21) Appl. No.: 12/075,365

(22) Filed: Mar. 11, 2008

(65) Prior Publication Data

US 2009/0026890 A1 Jan. 29, 2009

(30) Foreign Application Priority Data

Mar. 14, 2007 (EP) .................................. 07251071

(51) Int. Cl.
*H01L 41/08* (2006.01)
(52) U.S. Cl. ..................................................... 310/328
(58) Field of Classification Search ................. 310/328, 310/366
See application file for complete search history.

(56) References Cited

U.S. PATENT DOCUMENTS

| | | | | |
|---|---|---|---|---|
| 2,860,265 A | * | 11/1958 | Mason | ........................ 310/328 |
| 4,011,474 A | * | 3/1977 | O'Neill | ........................ 310/328 |
| 5,148,077 A | * | 9/1992 | Grawey et al. | ............... 310/328 |
| 5,295,288 A | * | 3/1994 | Dam et al. | .................. 29/25.35 |

* cited by examiner

*Primary Examiner*—Mark Budd
(74) *Attorney, Agent, or Firm*—Thomas N. Twomey

(57) ABSTRACT

Piezoelectric actuators of the type comprising a stack of layers of ferroelectric material and intervening electrodes which extend only part-way across the adjacent ferroelectric layers suffer differential remanent stress when electric fields are applied across the layers. To overcome this, a tensile stress is applied to the actuator along an axis substantially perpendicular to the layers of piezoelectric material in the actuator, which tensile stress is sufficient to mechanically align the dipoles, thus giving rise to a remanent strain which is uniform throughout the actuator. The actuator is advantageously heated while the tensile stress is applied, so as to increase the difference between the tensile strength of the material and the applied tensile stress. An alternative arrangement involves subjecting the actuator to a multidirectional stress and reducing the stress along the axis substantially perpendicular to the layers of piezoelectric material in the actuator. The entire process is performed on completed actuators. Under suitable temperature and load conditions no tensile margin fractures form and electrode tip discontinuity is reduced.

8 Claims, 7 Drawing Sheets

REDUCING STRESS GRADIENTS WITHIN PIEZOELECTRIC ACTUATORS

The present invention relates to methods of reducing stress gradients within piezoelectric actuators, such as those used in fuel injection systems for internal combustion engines.

Multilayer piezoelectric actuators can have a wide range of different structures, but common to all is the need to connect all internal electrodes of one polarity together via a common electrode, and to isolate the internal electrodes of one polarity from the common electrode of the opposite polarity. This polarity isolation is commonly achieved by having a non-electroded region on each internal electrode layer adjacent to the common electrode of the opposite polarity.

An example of a typical known piezoelectric actuator is shown in FIG. 1. The actuator 1 is in the form of a stack of layers 2 of ferroelectric, or piezoelectric, material, such as lead zirconate titanate (PZT) separated by internal electrodes 3a, 3b. A first group 3a of the electrodes are electrically connected to a first side electrode 4a, and a second group 3b of the electrodes are electrically connected to a second side electrode 4b. Electrodes of the first group 3a alternate with those of the second group 3b within the stack. In use, a voltage difference is applied across the side electrodes 4a, 4b, such that adjacent layers 2 of piezoelectric material within the stack are subjected to oppositely directed electric fields. By virtue of the piezoelectric nature of the material, the applied electric field gives rise to a change in the thickness of each layer 2, resulting in a corresponding change in the length of the actuator 1. This change in the length of the actuator 1 is used in practice to control the flow of fuel into the cylinders of an internal combustion engine.

One problem with such an arrangement results from the fact that each electrode 3a, 3b does not extend over the entire interface between its corresponding adjacent layers 2 of the ferroelectric material. The reason for this is to provide a physical separation between the electrodes of each group, e.g. 3a, and the side electrode of the other group, e.g. 4b, within a region termed the "isolation margin" 11, thereby to prevent electrical contact therebetween. A result of this is that, when a voltage difference is applied to the electrodes, the electric field does not extend over the entire layer. Thus, whereas the region of each ferroelectric layer 2 which is subjected to the electric field exhibits the change in thickness, the small region of each layer within the isolation margin which is not subjected to the electric field does not, and this results in undesirable stress gradients within each layer in the region of the edges of the electrodes, which can, in turn, lead to fractures within the actuator.

When such a piezoelectric ceramic element is ferroelectrically poled it increases in length, as mentioned above. This poling strain ($S_1$) consists of both a permanent and a temporary portion, as shown in FIG. 2. The permanent part (indicated at A) is called the remanent strain and persists after the electric field has been removed. The temporary part (indicated at B) is called the actuation strain, and this is re-developed each time field is applied. As can be seen in FIG. 2, no macroscopic strain is observed at electric field strengths below the coercive field (Ec). At field strengths in excess of the coercive field, there is an extension which is a combination of permanent and temporary strain.

The increase in length that occurs during poling, and subsequently during actuation, occurs only in that part of the ferroelectric material which lies between electrodes of opposite polarity. The result of this is that, during poling and the resulting extension, the regions of the inactive ceramic margin are placed in tension. This results in electrode delamination and ceramic fracture 12 across the inactive region, as illustrated in FIG. 3. The fractures extend across the isolation margins 11 and the end caps 13, which experience a combination of bending and lateral compression. Such fractures permit the ingress of materials, such as passivation materials and fuel, to enter the piezoelectric element.

Various solutions to this problem have been suggested, but to date none has proved entirely satisfactory.

It is an object of the invention to provide improved methods in which this problem is overcome, or at least mitigated.

The inventors of the present invention have realised that it is possible to align the axes of the dipoles (but not the direction of the dipoles along the axes) within the piezoelectric actuator by applying a longitudinal tensile stress, i.e. a tensile stress along a direction extending from a first end layer of the piezoelectric material to the other end layer. When the stress exceeds a critical value known as the coercive stress, there is a remanent strain which persists after the tensile stress is removed. By subjecting the piezoelectric material to a longitudinal tensile stress in excess of the coercive stress, the resulting remanent strain is uniform throughout the material.

Thus, in accordance with a first aspect of the present invention there is provided a method of reducing stress gradients within a piezoelectric actuator of the type comprising a stack of alternating layers of piezoelectric material and electrodes and having a first end and a second end at opposite ends of an axis substantially perpendicular to said layers of piezoelectric material, and wherein each of said electrodes extends over a part, but not all of, the interface between its respective adjacent layers of piezoelectric material. The method comprises applying a tensile stress to the piezoelectric actuator along said axis of a magnitude equal to or greater than the coercive stress of the material of the piezoelectric layers, thereby to create an axially directed strain extending throughout the actuator including the region of the interfaces between adjacent layers of piezoelectric material in which there is no electrode.

In accordance with a second aspect of the present invention there is provided a method of reducing stress gradients within a piezoelectric actuator of the type comprising a stack of alternating layers of piezoelectric material and electrodes and having a first end and a second end at opposite ends of an axis substantially perpendicular to said layers of piezoelectric material, and wherein each of said electrodes extends over a part, but not all of, the interface between its respective adjacent layers of piezoelectric material. The method comprises subjecting the piezoelectric actuator to a multidirectional compressive stress; and reducing the compressive stress applied along said axis by an amount sufficient to create an axially directed strain extending throughout the actuator including the region of the interfaces between adjacent layers of piezoelectric material in which there is no electrode.

With such arrangements, it will be appreciated that, during subsequent operation as an actuator, the piezoelectric material exhibits a permanent remanent strain, and the subsequent intermittent application of electric fields to the layers or piezoelectric layers within the actuator gives rise to additional strains which are substantially less than would occur in the absence of the permanent remanent strain, thereby reducing the stress gradients occurring in the region of the edges of the internal electrodes.

The application of such a multidirectional compressive stress can be achieved by placing the material within a housing containing a hydraulic fluid. In one embodiment, the housing further comprises a recess within which a piston is movable, the recess having hydraulic fluid therein, and wherein the compressive stress may be so reduced by attaching one end of the piezoelectric actuator to the piston and moving the piston along the recess to reduce the pressure within the recess.

In some cases, however, the tensile strength of the piezoelectric material may be insufficient to enable the desired tensile stress to be applied without giving rise to fracturing of the piezoelectric actuator.

It has been found that the difference between the tensile strength of piezoelectric materials and the coercive stress thereof increases above the temperature at which the tensile strength is a minimum.

Consequently, the method may advantageously further comprise the step of raising the temperature of the piezoelectric actuator to a level above that at which the tensile strength of the piezoelectric material is at a minimum, thereby to increase the difference between the tensile stress of the material and its coercive stress.

The alternating dipole direction necessary for piezoelectric actuation is subsequently created between electrodes of opposite polarity by a ferroelectric poling stage. However, it has been found desirable to apply a multidirectional compressive stress to the piezoelectric material at the same time.

Thus the method of the present invention may beneficially further comprise the step of poling the piezoelectric actuator by applying a first voltage to a first group of the electrodes and a second voltage to a second group of the electrodes thereby to polarise the layers of piezoelectric material, while subjecting the piezoelectric actuator to a multidirectional compressive stress, thereby to cause the actuator to undergo a substantially uniform permanent crystallographic realignment and dipole orientation.

These and other aspects, objects and the benefits of this invention will become clear and apparent on studying the details of this invention and the appended claims.

All references cited herein are incorporated by reference in their entirety. Unless otherwise defined, all technical and scientific terms used herein have the same meaning as commonly understood by one of ordinary skill in the art to which this invention belongs.

Reference has already been made to FIGS. 1 to 3 of the accompanying drawings, in which.

Figure 4:
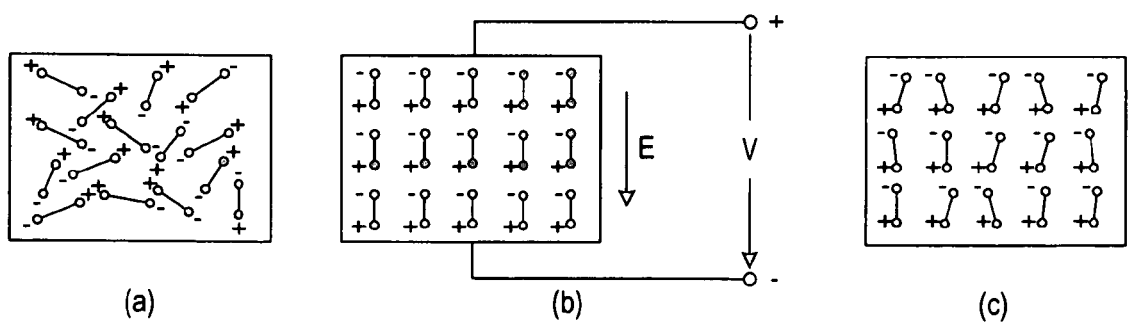
Figure 5:
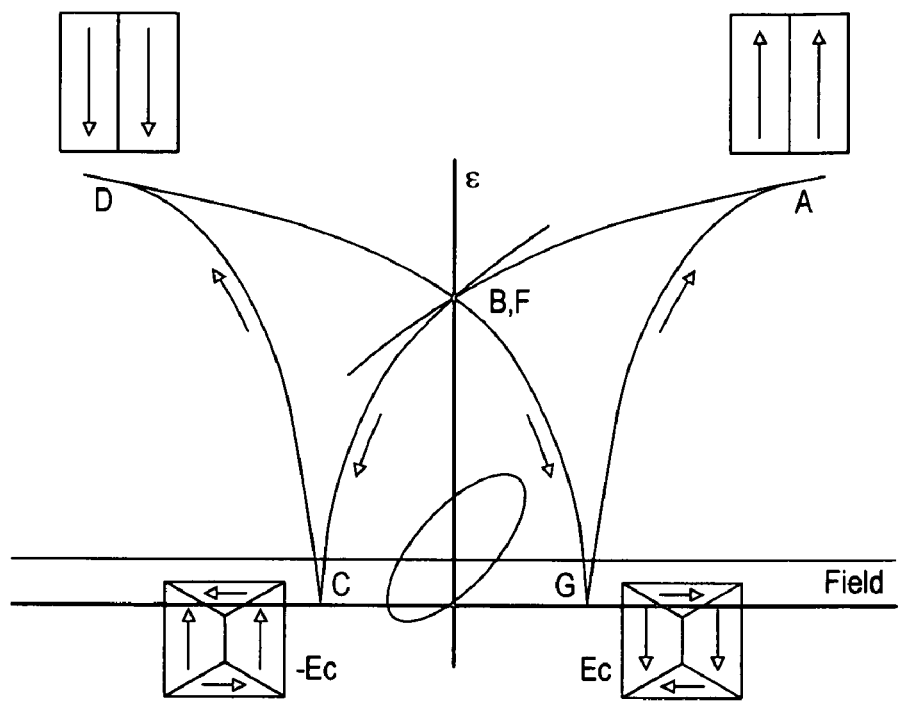
Figure 6:
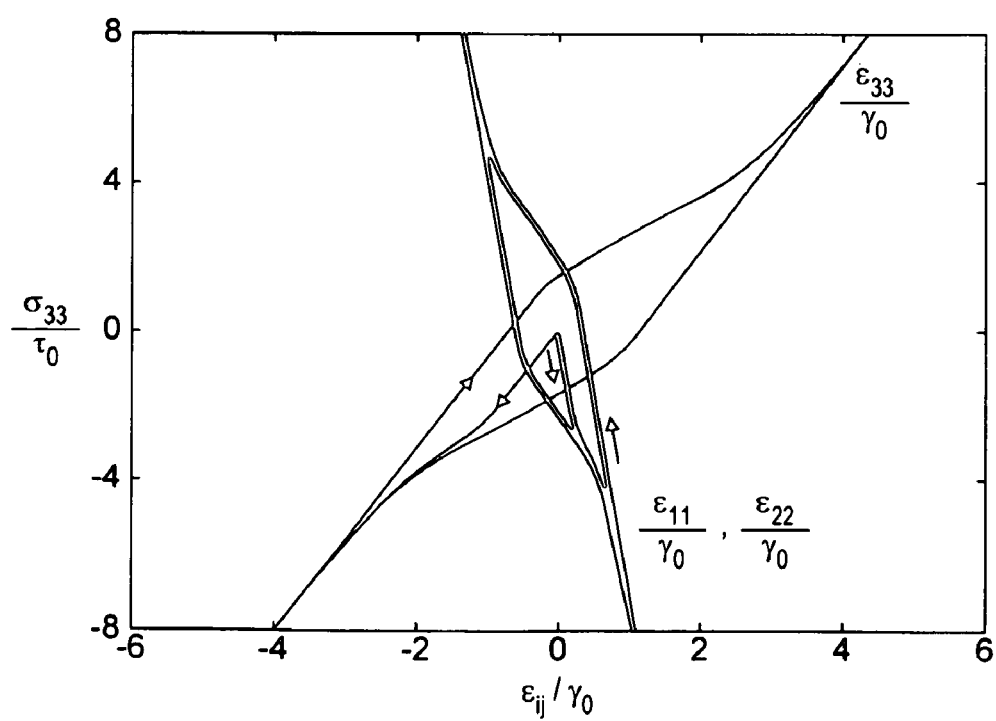
Figure 7:
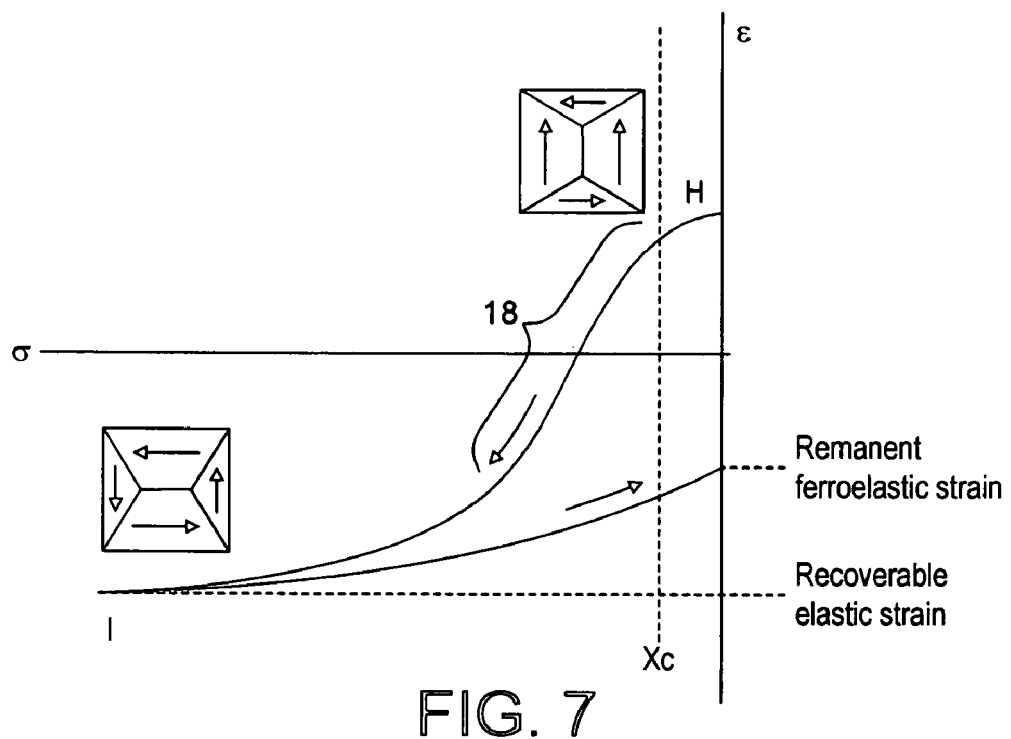
Figure 8:
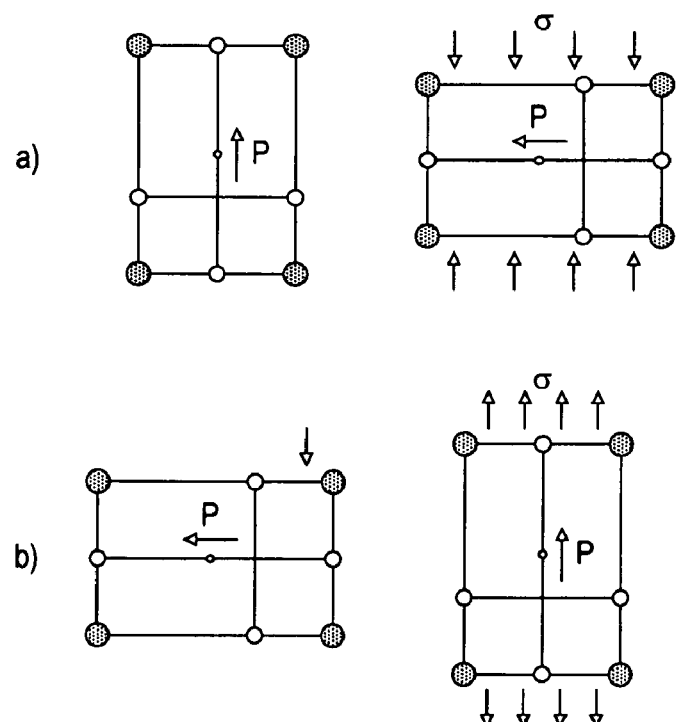
Figure 9:
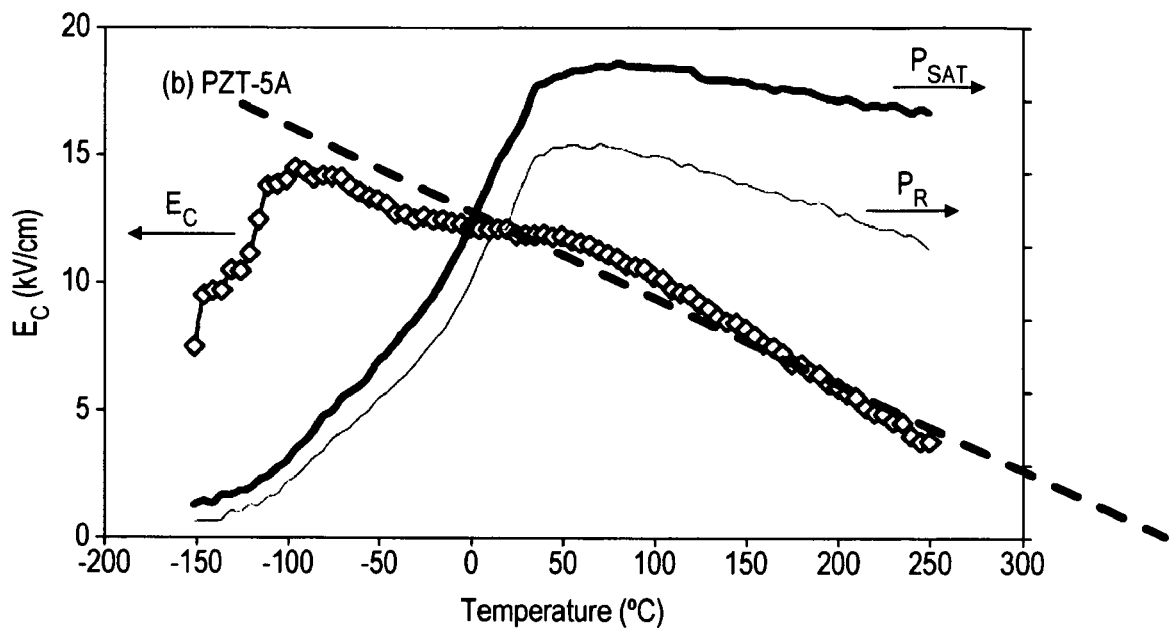
Figure 10:
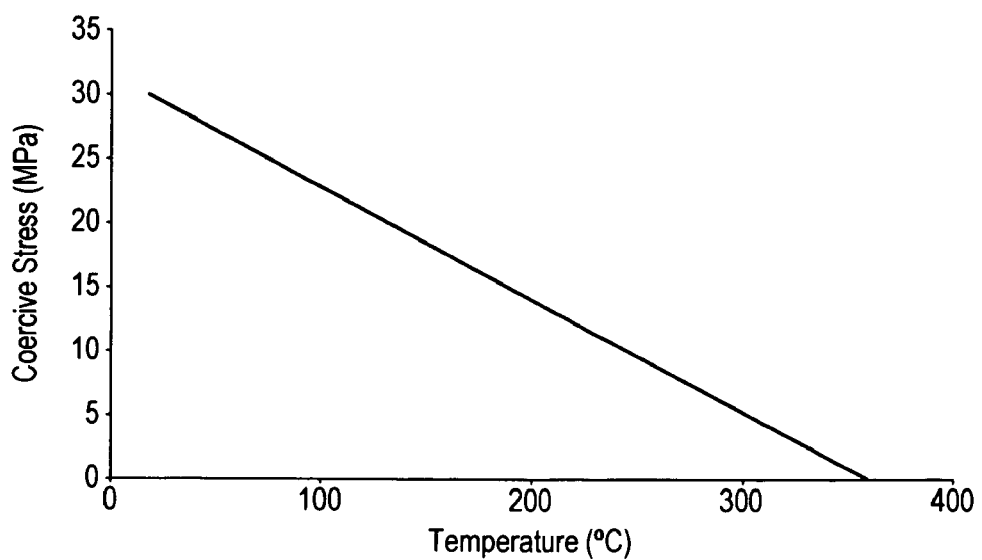
Figure 11:
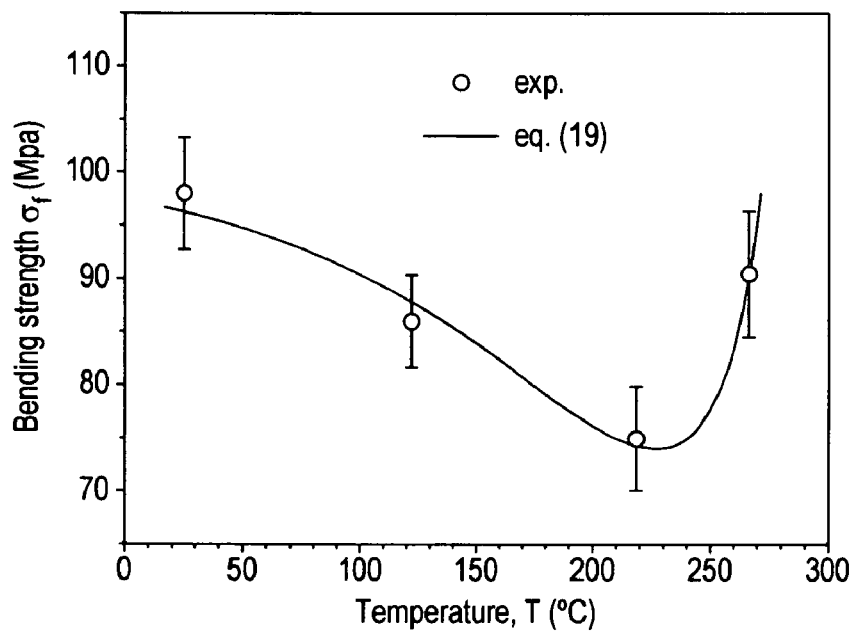
Figure 12:
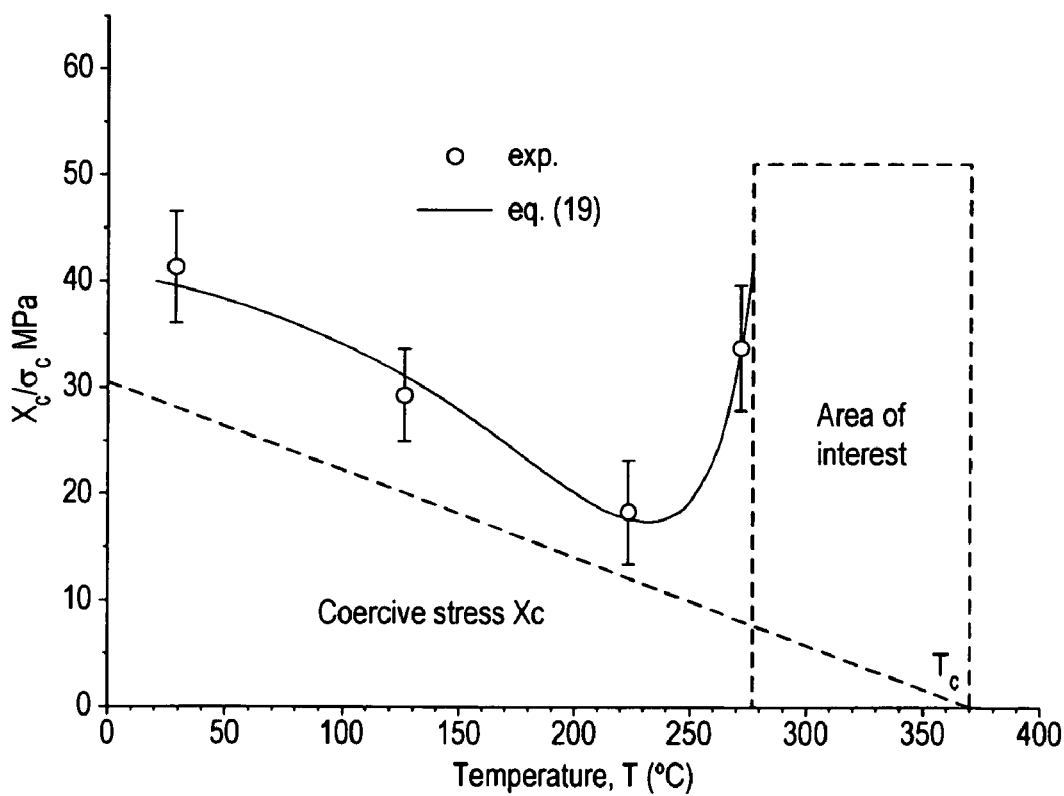
Figure 13:
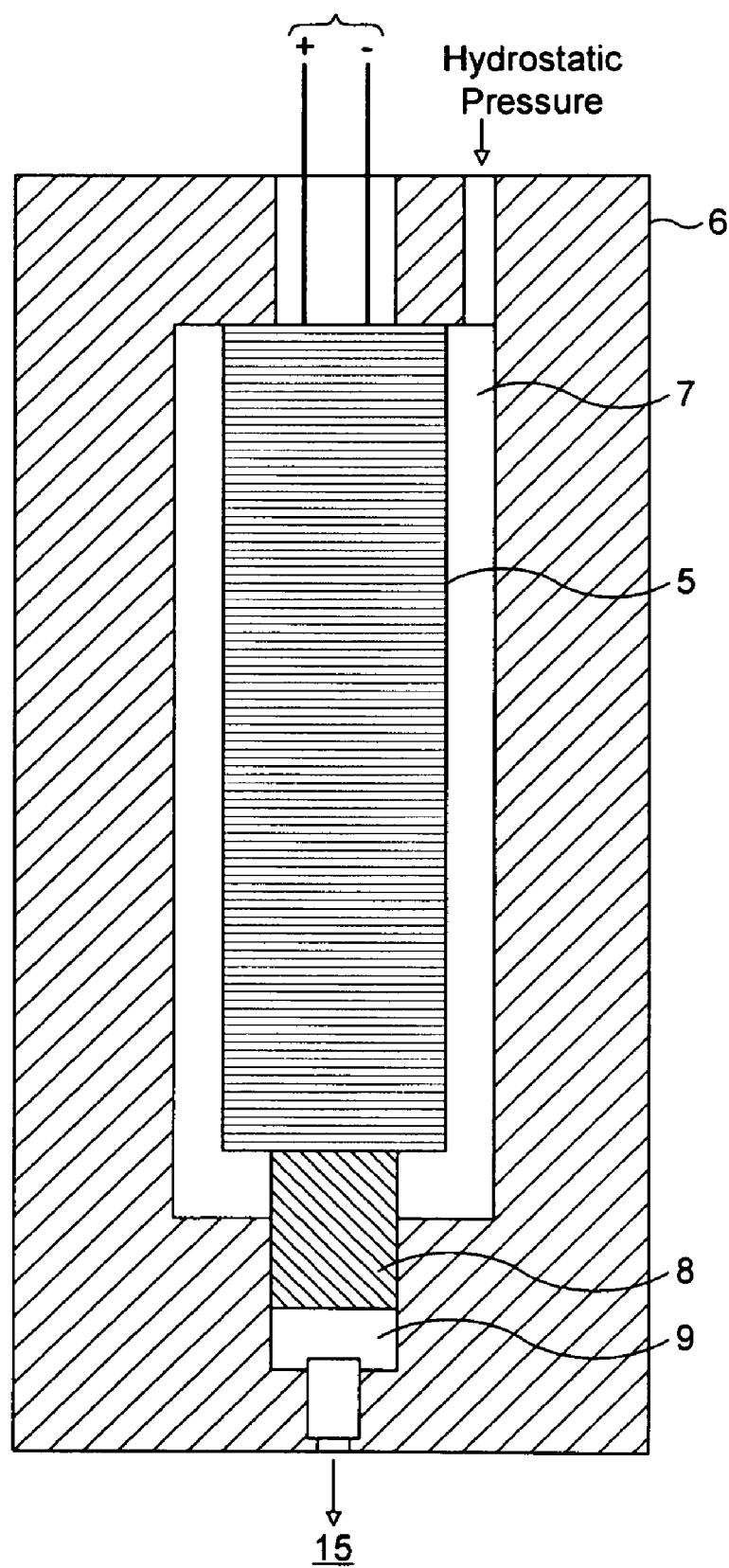

Embodiments of the present invention will now be described with reference to the accompanying drawings, in which:

FIG. 4 illustrates schematically the orientation of electric dipoles within a ferroelectric material, respectively before (a), during (b) and after (c) polarization;

FIG. 5 is a schematic graph illustrating the coupling between electric field strength and mechanical strain;

FIG. 6 is a graph illustrating the strain response of a ferroelastic polycrystal under cyclic uniaxial stress;

FIG. 7 is a schematic graph illustrating the relationship between stress and strain during ferroelastic domain reorganisation;

FIG. 8 is a schematic illustration showing the switching of a crystallographic axis following the application of compressive and tensile stresses;

FIG. 9 is a graph illustrating the relationship between the coercive electric field of PZT and temperature;

FIG. 10 is a graph illustrating the relationship between coercive stress and temperature;

FIG. 11 is a graph illustrating the relationship between bending stress and temperature;

FIG. 12 is a graph illustrating the variation of the coercive stress and tensile strength of PZT with temperature; and FIG. 13 illustrates the arrangement of an apparatus in accordance with an embodiment of the present invention.

In the present invention, the damage caused by the differential remanent stress described above is avoided by applying a longitudinal tensile stress sufficient to a mechanically align the dipoles. As mentioned above, a coercive tensile uniaxial load causes dipole axial alignment and not dipole directional alignment, but the remanent strain is equivalent in both. This avoids remanent margin tension and ameliorates electrode tip discontinuity.

The alternating dipole direction necessary for piezoelectric actuation is subsequently created between electrodes of opposite polarity by a ferroelectric poling stage.

The entire process is performed on completed actuators. Under suitable temperature and load conditions no tensile margin fractures form and electrode tip discontinuity is reduced.

Figure 1:
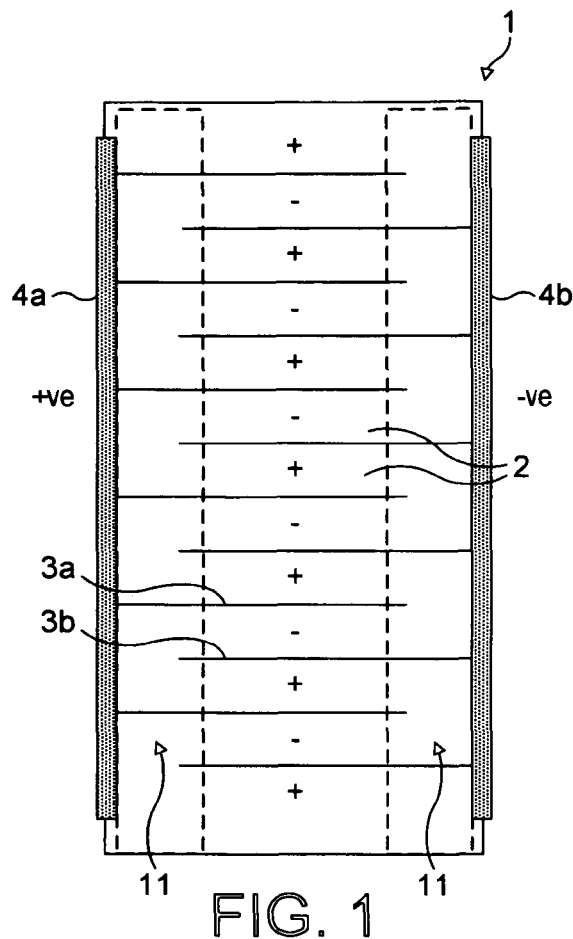
FIG. 1 is a cross-section of a conventional type of piezoelectric actuator.
Figure 2:
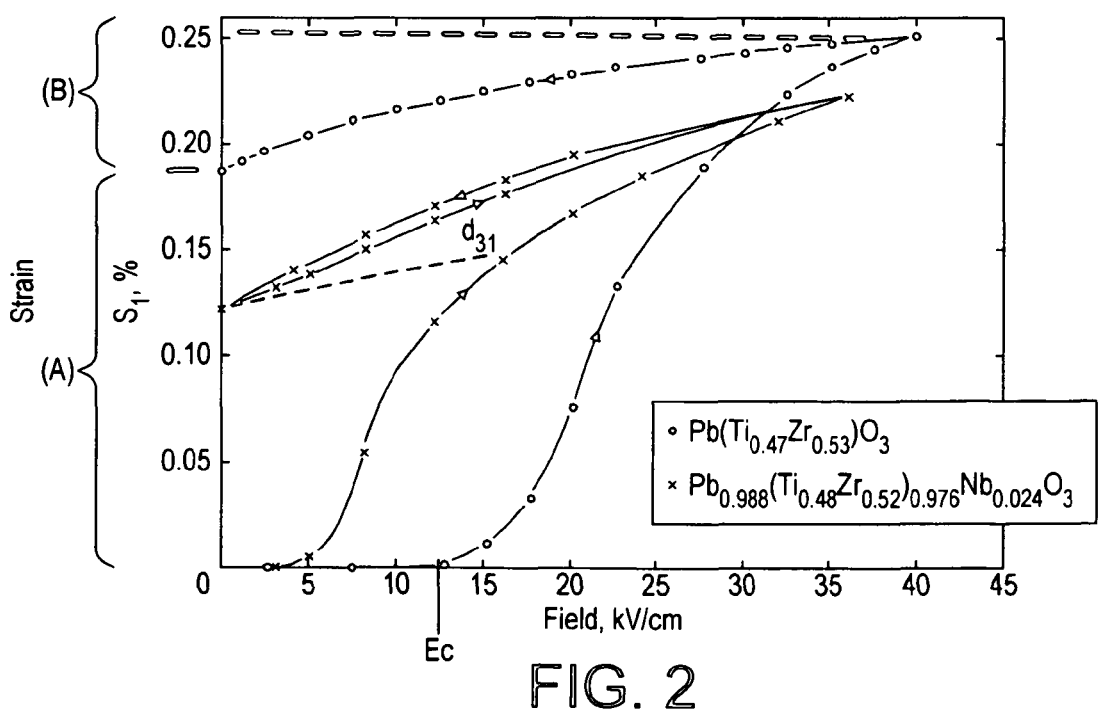
FIG. 2 is a graph illustrating the relationship between applied electric field and strain in a ferroelectric material.
Figure 3:
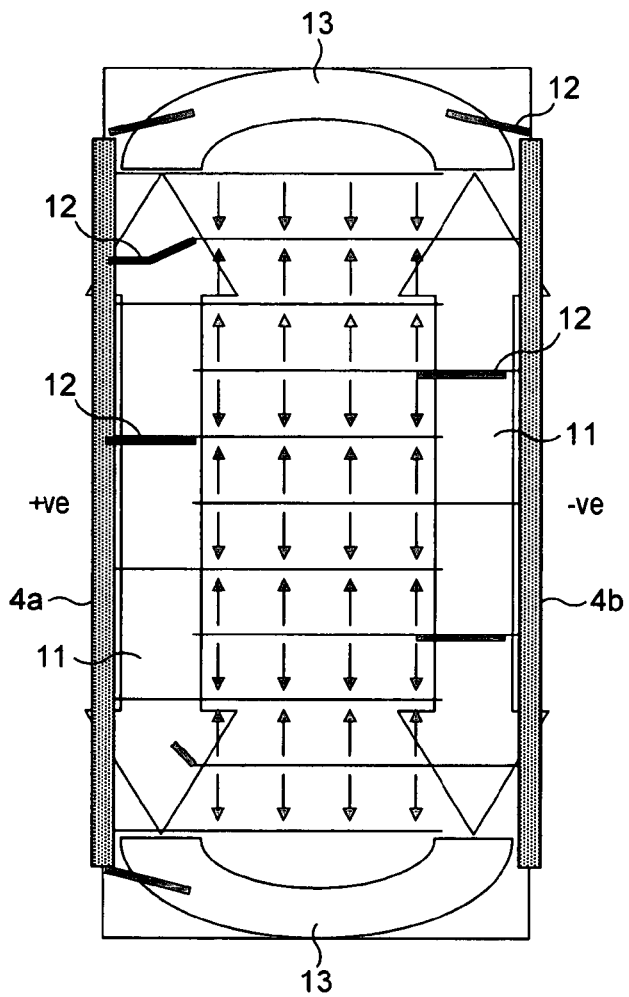
FIG. 3 is a schematic illustration of the undesirable stresses within a piezoelectric actuator which the present invention intends to reduce.

Ferroelectric ceramics such as PZT show dipole and domain reorientation under the influence of an electric field. The reorientation is evident as strain. In an unpoled ferroelectric ceramic this strain is not apparent below the coercive field (Ec), as can be seen in FIG. 2. As can be seen in FIG. 4, a ferroelectric ceramic such as PZT has a random arrangement of dipoles that prevents the piezoelectric effect on a macroscopic scale. When exposed to an electric field strength (E) in excess of the coercive field (Ec), the dipoles are aligned and the piezoelectric effect is evident. Thus, in an unpoled polycrystalline ferroelectric material the arrangement of dipoles and domains gives no net polarization direction and so no net piezoelectricity (FIG. 4a). Above the coercive field, domain and dipole reorganization occurs (FIG. 4b). This results in a net polarization direction and a remanent strain that remains after the field is removed (FIGS. 2 & 4c).

The dipoles within a ferroelectric material such as PZT can be re-aligned in any orientation in which a field greater than the coercive field is applied. FIG. 5 illustrates the coupling between the applied electric field and the resulting mechanical strain and shows that this can be reversed by applying an electric field in excess of the coercive field but in the opposition direction.

Ferroelectric ceramics are also ferroelastic. Ferroelasticity is manifested by dipole and domain reorganization under the influence of stress. FIG. 6 shows the strain response of a ferroelastic polycrystal under cyclic uniaxial stress. $\tau_0$ represents the shear stress at which non-linear shearing commences, and $\gamma_0$ represents the uniaxial stress at which the non-linear stress-strain relationship begins. Just as ferroelectricity requires a threshold coercive field $E_c$, ferroelasticity similarly requires a threshold stress for dipole reorganization. This is known as the coercive stress $X_c$, as indicated in FIG. 7, which shows that the ferroelastic domain reorganisation above the coercive stress gives rise to a remanent stain when the stress is removed. In the region 18 there is a high level of domain reorientation.

In uniaxial compression, 180° domains respond to the in-line load by switching to 90° orientation, producing a negative remanent strain, as indicated in FIG. 8a, which illustrates how a unit cell of a ferroic material, such as PZT, with its polarisation axis in line with a compressive stress ($\sigma$) which is greater than $X_c$ switches its z-axis through 90°. Thus the switching is in a direction orthogonal to that of the compressive load forming a preferred plane. Within this plane there is no dominant dipole direction.

In uniaxial tension the 90° domains respond to the in-line force by 90° domains switching to 180°, as shown in FIG. 8b, which illustrates how a unit cell with its polarisation axis at an angle of 90° to the direction of an applied tensile stress ($\sigma$) greater than $X_c$ switches to a common axis. Again, there is no dominant polarization direction to this switching, as the alignment is achieved mechanically, and dipole alignment requires a coercive field. Nevertheless the dipole axis preferentially aligns with the load axis and the ferroelectric ceramic attains a positive remanent strain like that attained by ferroelectric poling.

The only limitation on the tensile load applied to mechanically align the dipoles is the tensile strength of the ceramic. If this exceeded, the ceramic fractures.

The coercive stress necessary to realign dipoles ferroelastically at room temperature in PZT is about 30 MPa. The tensile strength of PZT at room temperature is about 90 MPa, when measured in three-point bend. The actual measured strength depends on factors such as surface finish, flaw population and grain boundary phase.

The measured strength also depends on how the ceramic is tested. There is evidence that the true uniaxial tensile strength of PZT is half that of the more often quoted three-point strength, suggesting a true tensile strength at room temperature of about 45 MPa. The coercive stress necessary to ferroelastically align dipoles uniaxially is now worryingly close to the true tensile failure strength. An attempt to create ferroelastic strain in this situation is likely to cause a significant number of tensile failures in the ceramic.

The coercive field necessary to ferroelectrically pole a ferroelectric material such as PZT reduces as temperature increases, as shown in FIG. 9, which illustrates that the coercive field necessary to pole and repole PZT ferroelectric ceramic decreases approximately linearly with temperature above a threshold temperature. The same is also true for coercive stress in ferroelasticity, as shown in FIG. 10. Easier dipole and domain wall movement is evident in both.

Relaxation is total upon reaching the Curie temperature, and beyond this temperature materials such as PZT cease to be ferroic.

The ultimate tensile strength of PZT is also affected by increased domain wall mobility. It does not however decrease to zero. The ultimate tensile strength decreases in a similar manner reaching a minimum at 230° C. due to inelastic relaxation of the 90° domain walls, but it increases again thereafter, as shown by the temperature dependence of the bending strength ($\sigma_f$) illustrated in FIG. 11.

If all of the known effects of temperature on coercive stress and tensile strength are considered, the two critical stresses compare, as shown by the temperature dependence of the coercive stress $X_c$ and the tensile strength $\sigma_c$ as shown in FIG. 12. It is clear that there is a region above the tensile strength minima where there is a large advantageous difference between coercive tensile strength and mechanical tensile strength. In this upper temperature region it is likely that PZT can be ferroelastically elongated without tensile fracture.

A completed actuator is axially loaded in tension at a temperature sufficient to cause dipole re-alignment but insufficient to break the stack.

The actuator is later electrically poled. At this poling stage no uniaxial compressive load is applied as this may cause detrimental domain reorientation in the isolation margins. Instead, a multidirectional compressive stress is applied during the poling stage, for example, using hydrostatic pressure as described in the present Applicant's co-pending European patent application no. EP05255753.5 filed on 16 Sep. 2005, thereby providing mechanical confinement for the remaining actuation stress.

The hydrostatic poling stage can be carried out with the actuator fitted in the injector body.

The strength of piezoceramics such as PZT is typically ten times greater in compression than in tension. Running of piezoelectric stacks under hydrostatic load has demonstrated that very high hydrostatic loads (at least 200 MPa) can be applied without significant effect on the activity of the actuator. This indicates that hydrostatic loads have little effect on the domain wall movement. When hydrostatic pressure is applied the actuator material is under compression in all three directions and therefore is much stronger than if it were in tension in any of the three axes. This effect can be used to tension pole the actuator without the need for high temperatures.

Thus, in an alternative embodiment of the present invention, the actuator is compressed hydrostatically and the axial component of the load would be reduced in order to ferroelastically pole the actuator. For example 100 MPa of hydrostatic load could be applied and then the axial component of the load could be reduced to 60 MPa. This gives a difference in stress of 40 MPa, which is sufficient to ferroelastically align the dipoles without requiring the actuator to be subjected to high temperatures: the effective strength of the electroceramic will have been increased to in excess of 80 MPa, so cracks will not be created. The actuator would then be hydrostatically confined and, an electric field used to ferrelectrically re-orientate dipoles within the active region of the multilayer.

FIG. 13 illustrates schematically an apparatus which could be used to perform these operations. The piezoelectric actuator 5 is subjected to a multidirectional compressive stress by placing the actuator 5 within a housing 6 containing a hydraulic fluid 7, and the compressive stress is reduced specifically along the direction from one end of the actuator 5 to the other by attaching the one end to a piston 8 which is arranged to move along a recess 9 formed within the housing and controlling the pressure within the recess 9, via a vent valve 15.

As described previously, electrically poling the actuator generates tension in the isolation margins. In accordance with a third embodiment of the present invention, a combination of this stress, increased temperature and hydrostatic stress is used to pole both the margins and active material simultaneously. In this case, the actuator is hydrostatically pressurized in oil at a temperature of 150° C., reducing the coercive stress to about 18 MPa, as shown in FIG. 12. The actuator is then electrically energized, which is capable of generating an axial load in the isolation margins in excess of 50 MPa. As shown previously, the hydrostatic pressure is capable of increasing the effective strength of the material so that it can survive this stress level. These margins then stretch ferroelastically until this load is reduced to the coercive stress level, e.g. 18 MPa. This is less than half the level of tension of that to which they would normally be exposed and is well below the material tensile strength over the full normal operating temperature range of −40° C. to +150° C.

This procedure may be carried out just below the Curie temperature when the coercive stress is negligible, giving maximum degree of ferroelastic axial growth in the inactive margins. However, the inventors of the present invention have found it convenient to select a temperature and a poling voltage which result in an equal tendency to re-pole the margins under the compressive and tensile stresses encountered in subsequent operation. This is likely to be approximately with equal maximum tensile and compressive stresses in the margin, but allowance should ideally be made for the relative time in each of these states, as it takes time to change the poling state.

Although particular embodiments of the invention have been disclosed herein in detail, this has been done by way of example and for the purposes of illustration only. The aforementioned embodiments are not intended to be limiting with respect to the scope of the appended claims, which follow. It is proposed by the inventors that various substitutions, alterations, and modifications may be made to the invention without departing from the spirit and scope of the invention as defined by the claims.

The invention claimed is:

1. A method of reducing stress gradients within a piezoelectric actuator of the type comprising a stack of alternating layers of piezoelectric material and electrodes and having a first end and a second end at opposite ends of an axis substantially perpendicular to said layers of piezoelectric material, and wherein each of said electrodes extends over a part, but not all of, the interface between its respective adjacent layers of piezoelectric material, the method comprising:

applying a tensile stress to the piezoelectric actuator along said axis of a magnitude equal to or greater than the coercive stress of the material of the piezoelectric layers, thereby to create an axially directed strain extending throughout the actuator including the region of the interfaces between adjacent layers of piezoelectric material in which there is no electrode.

2. A method of reducing stress gradients within a piezoelectric actuator of the type comprising a stack of alternating layers of piezoelectric material and electrodes and having a first end and a second end at opposite ends of an axis substantially perpendicular to said layers of piezoelectric material, and wherein each of said electrodes extends over a part, but not all of, the interface between its respective adjacent layers of piezoelectric material, the method comprising:

subjecting the piezoelectric actuator to a multidirectional compressive stress; and reducing the compressive stress applied along said axis by an amount sufficient to create an axially directed strain extending throughout the actuator including the region of the interfaces between adjacent layers of piezoelectric material in which there is no electrode.

3. A method as claimed in claim 2, wherein the step of subjecting the piezoelectric actuator to a multidirectional compressive stress comprises placing the actuator within a housing containing a hydraulic fluid.

4. A method as claimed in claim 3, wherein said housing further comprises a recess within which a piston is movable, said recess having hydraulic fluid therein, and wherein the step of reducing the compressive stress applied along said axis comprises attaching one end of the piezoelectric actuator to a piston arranged to move along said recess formed within the housing and reducing the hydraulic fluid pressure within the recess.

5. A method as claimed in claim 1, further comprising raising the temperature of the piezoelectric actuator to a level above that at which the tensile strength of the piezoelectric material is at a minimum, thereby to increase the difference between the tensile stress of the material and its coercive stress.

6. A method as claimed in claim 2, further comprising raising the temperature of the piezoelectric actuator to a level above that at which the tensile strength of the piezoelectric material is at a minimum, thereby to increase the difference between the tensile stress of the material and its coercive stress.

7. A method as claimed in claim 1, wherein said actuator comprises a first and a second group of the electrodes, the electrodes of said first group being interdigitated between the electrodes of said second group, and wherein the method further comprises poling the piezoelectric actuator by applying a first voltage to said first group of the electrodes and a second voltage to said second group of the electrodes thereby to polarise the layers of piezoelectric material, while subjecting the piezoelectric actuator to a multidirectional compressive stress, thereby to cause the actuator to undergo a substantially uniform permanent crystallographic realignment and dipole orientation.

8. A method as claimed in claim 2, wherein said actuator comprises a first and a second group of the electrodes, the electrodes of said first group being interdigitated between the electrodes of said second group, and wherein the method further comprises poling the piezoelectric actuator by applying a first voltage to said first group of the electrodes and a second voltage to said second group of the electrodes thereby to polarise the layers of piezoelectric material, while subjecting the piezoelectric actuator to a multidirectional compressive stress, thereby to cause the actuator to undergo a substantially uniform permanent crystallographic realignment and dipole orientation.

* * * * *